(12) United States Patent
Tamaki et al.

(10) Patent No.: US 7,504,837 B2
(45) Date of Patent: Mar. 17, 2009

(54) ELECTRICAL CHARACTERISTICS MEASUREMENT METHOD AND ELECTRICAL CHARACTERISTICS MEASUREMENT DEVICE

(75) Inventors: Naoya Tamaki, Tokyo (JP); Eiji Hankui, Tokyo (JP)

(73) Assignee: NEC Corporation, Tokyo (JP)

( * ) Notice: Subject to any disclaimer, the term of this patent is extended or adjusted under 35 U.S.C. 154(b) by 9 days.

(21) Appl. No.: 10/599,243

(22) PCT Filed: Nov. 17, 2004

(86) PCT No.: PCT/JP2004/017074

§ 371 (c)(1),
(2), (4) Date: Sep. 22, 2006

(87) PCT Pub. No.: WO2005/093437

PCT Pub. Date: Oct. 6, 2005

(65) Prior Publication Data
US 2007/0182428 A1 Aug. 9, 2007

(30) Foreign Application Priority Data
Mar. 26, 2004 (JP) ............................. 2004-093813

(51) Int. Cl.
*G01R 27/08* (2006.01)
(52) U.S. Cl. ...................... 324/724; 324/72.5; 324/649; 324/754
(58) Field of Classification Search .................. 324/724, 324/754
See application file for complete search history.

(56) References Cited

U.S. PATENT DOCUMENTS
5,457,399 A    10/1995   Krumm ...................... 324/758

(Continued)

FOREIGN PATENT DOCUMENTS
EP            0605812         7/1994

(Continued)

OTHER PUBLICATIONS
"A Guide to Better Vector Network Analyzer Calibrations for Probe-Tip Measurements"; Cascade Microtech Technical Brief TECHBRIEF4-0694, copyright 1994 Cascade Microtech, Inc., Beaverton OR 97006 USA.*

(Continued)

*Primary Examiner*—Timothy J Dole
*Assistant Examiner*—Benjamin M Baldridge
(74) *Attorney, Agent, or Firm*—Hayes Soloway P.C.

(57) ABSTRACT

The characteristics of an object are measured using an electrical characteristics measurement device in which a probe includes a signal terminal, a ground terminal, and a variable resistance element is connected via a coaxial cable to a measuring instrument. The calibration of the probe entails adjusting the resistance value of the variable resistance element, setting the impedance of the distal end vicinity of the probe essentially to zero, and establishing a match with the coaxial cable and measuring instrument. When the electrical characteristics of the object are measured, the resistance value of the variable resistance element is varied in accordance with the impedance created by the side of the circuit containing the measurement object as viewed from the contact between the object and the signal terminal and ground terminal, and the input impedance of the probe is set to a value that does not affect the operation of the object.

7 Claims, 5 Drawing Sheets

U.S. PATENT DOCUMENTS

| | | | |
|---|---|---|---|
| 6,242,930 B1 * | 6/2001 | Matsunaga et al. | 324/754 |
| 6,617,864 B2 * | 9/2003 | Inoue et al. | 324/754 |
| 6,970,001 B2 * | 11/2005 | Chheda et al. | 324/649 |
| 2001/0017549 A1 * | 8/2001 | Inoue et al. | 324/754 |

FOREIGN PATENT DOCUMENTS

| | | |
|---|---|---|
| JP | 58-90176 | 5/1983 |
| JP | 2-32064 | 2/1990 |
| JP | 04-206845 | 7/1992 |
| JP | 6-244263 | 9/1994 |
| JP | 11-153617 | 6/1999 |
| JP | 2001-133482 | 5/2001 |
| JP | 2001-349903 | 12/2001 |
| JP | 2003-329725 | 11/2003 |

OTHER PUBLICATIONS

Agilent 8510C Network Analyzer Data Sheet, Agilent Technologies, Inc. copyright 2002, 2006.*

Agilent 8510C Network Analyzer Data Sheet, Agilent Technologies, Inc., copyright 2002, 2006, Agilent Technologies, Inc.*

* cited by examiner ent method and an electrical characteristics measurement device for disconnecting, short-circuiting, or connecting a load between the signal and ground terminals of a probe for measuring electrical characteristics to perform calibrations, and more particularly relates to an electrical characteristics measurement method and an electrical characteristics measurement device for measuring the reflection characteristics of printed substrate circuits, devices, and other components.

BACKGROUND ART

A probe comprising a single signal terminal and at least one ground terminal is generally provided to a conventional electrical characteristics measurement device used for measuring the electrical characteristics of printed substrate circuits, devices, and other components that handle high frequency signals (see Patent Documents 1 to 3, for example). FIG. 8 is a schematic view of a convention electrical characteristics measurement device. In a conventional electrical characteristics measurement device, one end of a coaxial cable 105 is connected to a measuring instrument 106, and a probe 101 is connected to the other end of the coaxial cable 105, as shown in FIG. 8. The probe comprises a signal terminal 102 in contact with a conductor pattern 109 formed on a printed circuit board or another measurement object 108, and a ground terminal 103 that is in contact with a conductor pattern 110 and is at ground potential. In the probe 101, a resistance element 104 is disposed in the vicinity of the signal terminal 102, and the impedance of the resistance element is constant.

In this type of conventional electrical characteristics measurement device, a coaxial cable having a characteristic impedance of 50Ω and a probe having an input impedance of 50Ω (50-Ω probe) are generally used in order to match the impedance of the measuring instrument 106 when the measuring instrument 106 has an input impedance of 50Ω (is a 50-Ω measuring instrument). However, a 50-Ω probe has a problem in that the input impedance affects the circuit operation of the measurement object, and measurement errors are magnified.

In a high-impedance probe in which the load effect is reduced by increasing the input impedance, the effect on the circuit operation of a measurement object is small in comparison with a 50-Ω probe, but the impedance cannot be matched to that of a 50-Ω measuring instrument. For this reason, a 50-Ω probe can be used when it is necessary to match the impedance of the 50-Ω measuring instrument and the probe, to disconnect the ground terminal 103 and the signal terminal 102 of the distal end of the probe must, to form a short circuit, and to connect a load in order to calibrate the entire measuring device, but a high-impedance probe cannot be used in such cases.

A switchable probe is also used in conventional practice (see Patent Document 4). The probe comprises two circuits having mutually different input impedances, and a switch for switching between the two. In the conventional switchable probe, one of the circuits has an impedance of 50Ω and the other circuit has high impedance. The effect on the circuit operation of a measurement object can be minimized and impedance matching with a 50Ω measuring instrument can be ensured by switching the impedance during calibration and during measurement by using a switch.

[Patent Document 1] Japanese Laid-open Patent Application No. 4-206845

[Patent Document 2] Japanese Laid-open Patent Application No. 2001-133482

[Patent Document 3] Japanese Laid-open Patent Application No. 58-90176

[Patent Document 4] Japanese Laid-open Utility Model Application No. 2-32064

DISCLOSURE OF THE INVENTION

Problems that the Invention is to Solve

However, the above-described prior art has the following problems. In order to reduce the effect on the circuit operation of a measurement object and to sufficiently reduce measurement error, the impedance of the probe must be made sufficiently high in comparison with the impedance of the measurement object. When, however, the impedance of the measurement object is not known or when the conventional electrical characteristics measurement device shown in FIG. 8 is used, the impedance of the probe 101 is fixed and is therefore not necessarily sufficiently high in comparison with the impedance of the measurement object. For this reason, there is a problem in that adequate measurement accuracy cannot always be attained even when the above-described switchable probe is used. This depends on the impedance created by the measurement object 108 as a load, i.e., the impedance created by the side of the circuit containing the measurement object 108 as viewed from the contact between the measurement object 108 (conductor patterns 109 and 110) and the signal terminal 102 and ground terminal 103. Another problem is that when the impedance of the probe is too high, the electric current flowing to the measuring instrument connected to the probe is low, and the measurement precision is reduced.

The present invention was contrived in view of the above described problems, and an object of the present invention is to provide an electrical characteristics measurement method and electrical characteristics measurement device that reduce the effect on the circuit operation of the measurement object, and that can measure electrical characteristics with high precision when the distal end of the probe is disconnected, a short circuit is created, and a load is connected in order to perform calibration.

MEANS OF SOLVING THE PROBLEMS

In the electrical characteristics measurement method according to the first aspect of the present invention, a probe comprising a single signal terminal, at least one ground terminal, and a variable impedance element disposed in the vicinity of a terminal selected from the signal terminal and the ground terminal is used to measure the electrical characteristics of a measurement object, the method characterized in comprising: a step for setting the impedance of the variable impedance element substantially to 0, disconnecting the signal terminal and ground terminal of the probe at the distal end of the probe, forming a short circuit, and connecting a load to perform calibrations; and a step for making the impedance of the variable impedance element to be greater than a prescribed value, and placing the signal terminal and the ground terminal in contact with the measurement object to measure the electrical characteristics thereof. Setting the impedance substantially to 0 refers to setting the impedance essentially to 0, and setting the impedance exactly to 0 is not required.

In the present invention, a probe is used that comprises a variable impedance element disposed in the vicinity of the signal terminal or the ground terminal. Therefore, the impedance of the variable impedance element can be made greater than a prescribed value, and the impedance can be made sufficiently high so as to match the impedance of a measurement object. The impedance of the probe is thereby made excessively high and the input electric current to the measuring instrument connected to the probe is reduced. Therefore, the effect on the circuit operation of the measurement object is reduced without also suffering lower measurement precision, and measurement errors can be adequately reduced.

A parameter for evaluating the measurement error of the electrical characteristics of the measurement object may be set in the step for measuring the electrical characteristics, wherein the parameter is set so that the measurement error becomes smaller as the value of the parameter decreases; and the impedance of the variable impedance element may be increased until the parameter becomes equal to or less than an allowable value set in advance. The measurement error can thereby be further reduced. The calibration step comprises, for example, a step for disconnecting and calibrating the signal terminal and the ground terminal in a location separated from peripheral objects; a step for electrically connecting the signal terminal and the ground terminal to a single conductor to perform a short-circuit calibration; and a step for electrically connecting the signal terminal and the ground terminal to a terminal of a 50-Ω resistor to perform a loaded calibration.

The electrical characteristics measurement device according to the second aspect of the present invention is an electrical characteristics measurement device for measuring the electrical characteristics of a measurement object, comprising a measuring instrument, and a probe that is connected to the measuring instrument and has a single signal terminal and at least one ground terminal, the device characterized in that a variable impedance element is disposed in the vicinity of one terminal selected from the signal terminal and the ground terminal of the probe.

In the present invention, since a variable impedance element is disposed in the vicinity of the signal terminal or ground terminal of the probe, the input impedance of the probe is variable, and a suitable input impedance can be set when the distal end of the probe is disconnected, a short circuit is formed, and a load is connected to perform calibration during measurement of the electrical characteristics of a measurement object.

Also, the distance between the variable impedance element and the distal end of the signal terminal or the ground terminal, as one of the terminals provided with the variable impedance element, may be equal to or less than 1/10 of the measuring wavelength when the electrical characteristics of the measurement object are measured. The effect of the wavelength on the electrical characteristics to be measured can thereby be minimized.

Furthermore, the electrical characteristics measurement device may comprise an input unit for inputting the allowable value of a parameter for evaluating the measurement error of the electrical characteristics of the measurement object; a storage and computation unit for storing the impedance of the variable impedance element, the measurement values obtained from the probe, and the relational characteristics thereof, calculating a parameter for evaluating the measurement error from the relational characteristics, and comparing the parameter and the allowable value; and an output unit for outputting the results of the storage and computation unit.

EFFECTS OF THE INVENTION

In accordance with the present invention, a variable impedance element is disposed in the vicinity of the signal terminal or the ground terminal of the probe, and the impedance of the variable impedance element can therefore be made sufficiently high so as to match the impedance of the measurement object. The effect that the input impedance of the probe has on the circuit operation of the measurement object is therefore reduced, and, in particular, electrical characteristics that require calibration in the terminal conditions, i.e., disconnection, short-circuiting, and loading, at the distal end of the probe can be measured with high precision in a simple manner.

Figure 1:
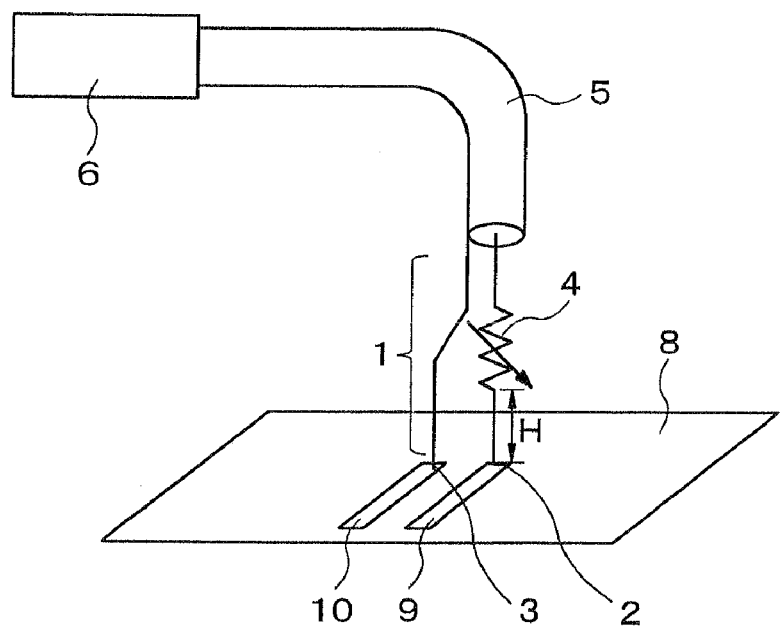
FIG. 1 is a schematic view of the electrical characteristics measurement device of the first embodiment of the present invention.

DESCRIPTION OF THE REFERENCE NUMERALS 1, 11, 15, 101; probe
2, 12, 16, 102; signal terminal
3, 13, 17, 103; ground terminal
4, 14, 18; variable resistance element
5, 105; coaxial cable
6, 106; measuring instrument
8, 28, 108; measurement object
9, 10, 29, 30, 109, 110; conductor pattern
21; resistance wire
22; insulator
23; contact
24, 25; terminal
41; driver IC 42; line
43; receiver IC
104; resistance element

BEST MODE FOR CARRYING OUT THE INVENTION

Embodiments of the present invention are described in detail below with reference to the attached diagrams. The first embodiment of the present invention is described first. FIG. 1 is a schematic view of the electrical characteristics measurement device of the first embodiment of the present invention. The electrical characteristics measurement device of the present embodiment is configured with one end of a coaxial cable 5 connected to a measuring instrument 6, and the other end of the coaxial cable 5 connected to a probe 1 for measuring electrical characteristics, as shown in FIG. 1. A measurement unit, a storage and computation unit, and input and output units, for example, are disposed in the measuring instrument 6. Alternatively, a recording and computation unit, and input and output units are connected to the measuring instrument 6. The input impedance of the measuring instrument 6 is 50Ω, for example, and the characteristic impedance of the coaxial cable 5 is 50Ω, for example.

A signal terminal 2 and ground terminal 3 are provided to the probe 1 in the electrical characteristics measurement device of the present embodiment, the signal terminal 2 makes contact with a conductor pattern 9 disposed on a printed circuit board or another measurement object 8, and the ground terminal 3 makes contact with a conductor pattern 10 disposed on a measurement object 8 and is at ground potential. A variable resistance element 4 is disposed as a variable impedance element in the vicinity of the signal terminal 2 of the probe 1, and the impedance in the vicinity of the signal terminal 2 of the probe 1 is thereby made variable. A distance H between the variable resistance element 4 and signal terminal 2 is preferably sufficiently shorter than the measuring wavelength. Specifically, the distance is preferably ¹⁄₁₀ or less the measuring wavelength. There is accordingly no longer a need to consider the relationship between the electrical length and the wavelength between the variable resistance element 4 and measurement object 8, and the electrical characteristics of the measurement object 8 can be measured easily and with good precision.

Figure 2:
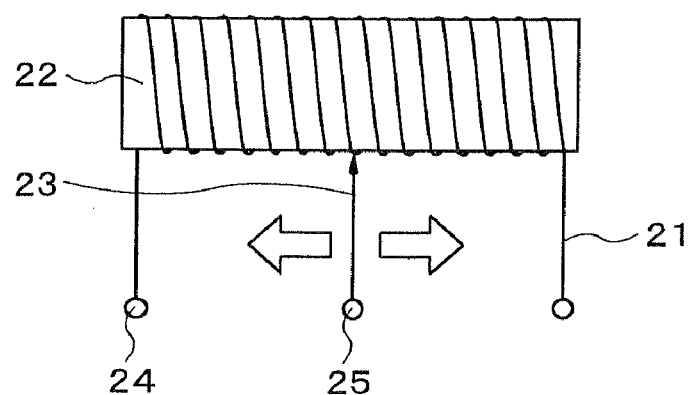
FIG. 2 is a schematic view of a slide-wire resistor.

An element whose resistance value can be adjusted, such as a slide-wire resistor, for example, can be used as the variable resistance element 4 disposed in the probe 1. FIG. 2 is a schematic view of a slide-wire resistor. The slide-wire resistor comprises a resistance wire 21 wound on an insulator 22. The impedance between a terminal 24 connected to the end of the resistance wire 21 and a terminal 25 connected to the contact 23 can be varied by bringing the contact 23 into contact with the resistance wire 21 at a suitable position in the lengthwise direction of the insulator 22, as shown in FIG. 2.

Figure 3:
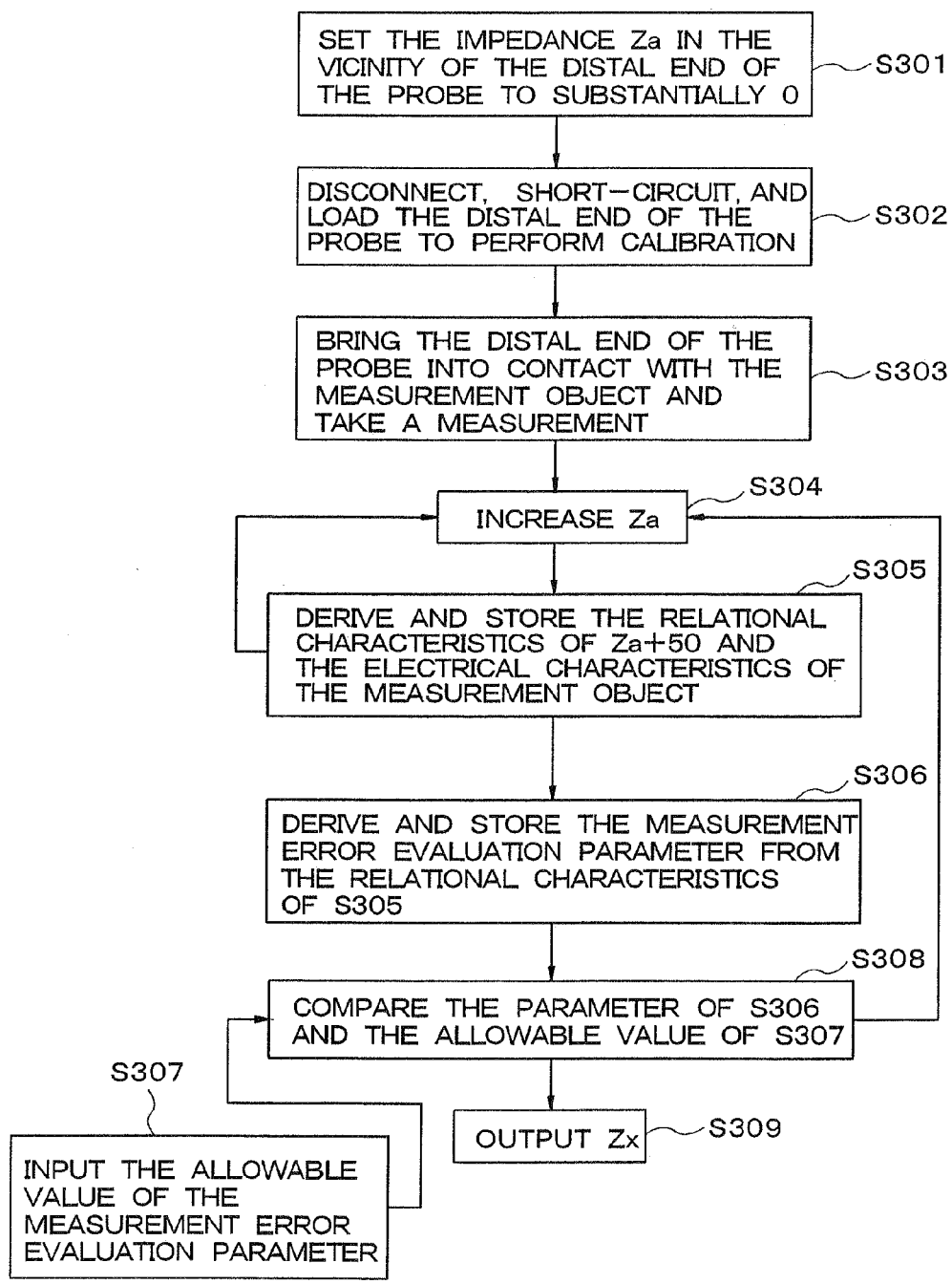
FIG. 3 is a flowchart of the electrical characteristics measurement method performed using the electrical characteristics measurement device of the first embodiment of the present invention.
Figure 4:
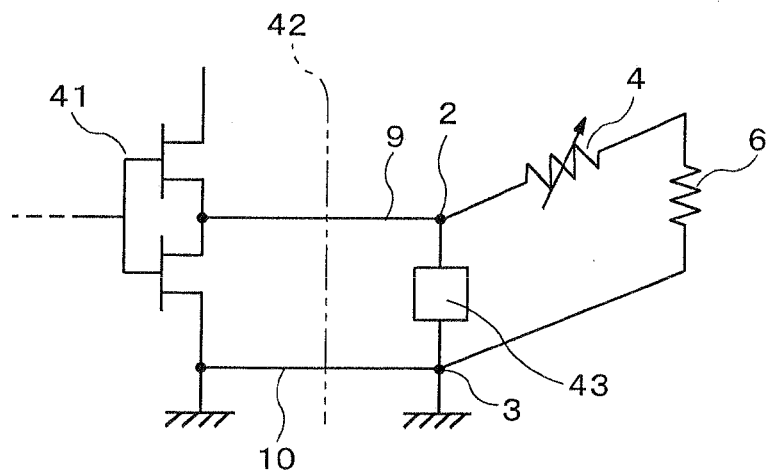
FIG. 4 is an equivalent circuit diagram of the electrical characteristics measurement method performed using the electrical characteristics measurement device of the first embodiment of the present invention.

Following is a description of the operation of the electrical characteristics measurement device of the present embodiment configured in the manner described above, i.e., the electrical characteristics measurement method performed using the electrical characteristics measurement device. FIG. 3 is a flowchart of the electrical characteristics measurement method performed using the electrical characteristics measurement device of the first embodiment of the present invention. FIG. 4 is an equivalent circuit diagram of the method for measuring the electrical characteristics. In the present embodiment, an example is described of a case in which the distal end of the probe 1 is brought into contact between the ground and the output signal line of a CMOS driver IC 41 connected to a receiver IC 43, and the impedance Zxo thereof is measured, as shown in FIG. 4.

First, the resistance value of the variable resistance element 4 is changed and the impedance Za of the vicinity of the distal end of the probe 1 is set to substantially 0, as shown in FIG. 3 (step S301). The impedance of the probe 1, the coaxial cable 5, and the measuring instrument 6 can thereby be matched. The signal terminal 2 and ground terminal 3 at the distal end of the probe are disconnected, a short circuit is formed, and a load is connected to perform calibration (step S302). Specifically, the signal terminal 2 and ground terminal 3 are disconnected and calibrated while kept at a sufficient distance from peripheral objects; the terminals are electrically connected to a single conductor to perform short-circuit calibration; and an electrical connection is established with the terminals of a substantially 50-Ω resistor to perform a loaded calibration.

The signal terminal 2 and ground terminal 3 of the probe 1 are thereafter connected to the corresponding conductor patterns 9 and 10 disposed in the measurement object 8 (step S303). Signals received from the probe 1 can thereby be transmitted to the measuring instrument 6 by way of the coaxial cable 5, and the impedance Zx (Ω) can be measured in the measuring instrument 6. The impedance Zxo (Ω) created by the measurement object 8 as a load, i.e. the impedance created by the side of the circuit containing the measurement object 8 as viewed from the contact between the conductor patterns 9 and 10 and the signal terminal 2 and ground terminal 3 of the probe 1, can be calculated from the impedance Zx (Ω) measured by the measuring instrument 6 and the impedance Za (Ω) in the vicinity of the distal end of the probe 1 by using Eq. 1 noted below.

$$Zxo = Zx - Za \qquad [\text{Eq. 1}]$$

By disposing a variable resistance element 4 in the vicinity of the distal end of the probe 1 and allowing the impedance of the probe 1 to be varied in accordance with the electrical characteristics measurement device of the present embodiment, it is no longer necessary to exchange a plurality of parts whose impedances are mutually different at the distal end of the probe. For this reason, the input impedance of the probe 1 can easily be varied. Also, since the impedance Za in the vicinity of the distal end of the probe 1 and the impedance Zxo (Ω) of the measurement object 8 are in a serial relationship, the impedance Zxo of the measurement object 8 can easily be calculated with the aid of Eq. 1 noted above. In the electrical characteristics measurement device of the present embodiment, the distance H between the measurement object 8 and the variable resistance element 4 is preferably sufficiently less than the measuring wavelength, i.e., equal to or less than ¹⁄₁₀ the measuring wavelength. The impedance Zxo (Ω) of the measurement object 8 can thereby be calculated with good precision by using a simple lump-constant formula such as Eq. 1 noted above.

When the circuit is operating, the load impedance Zl (Ω) of the driver IC 41, created by the side of the circuit containing the measuring instrument 6 as viewed from the line 42 shown in FIG. 3, is changed from the input impedance Zr (Ω) of the receiver IC 43 to Zr×(Za+50)/{Zr+(Za+50)} (Ω) by bringing the probe 1 into contact with the conductor patters 9 and 10. In other words, the load impedance Zl (Ω) of the driver IC 41 can be expressed as being formed by a serial connection between the input impedance Zr (Ω) of the receiver IC 43 and the input impedance Za+50 (Ω) of the probe 1, which is the sum of the impedance Za (Ω) in the vicinity of the distal end of the probe 1 and the impedance (50Ω) of the measuring instrument 6.

Figure 8:
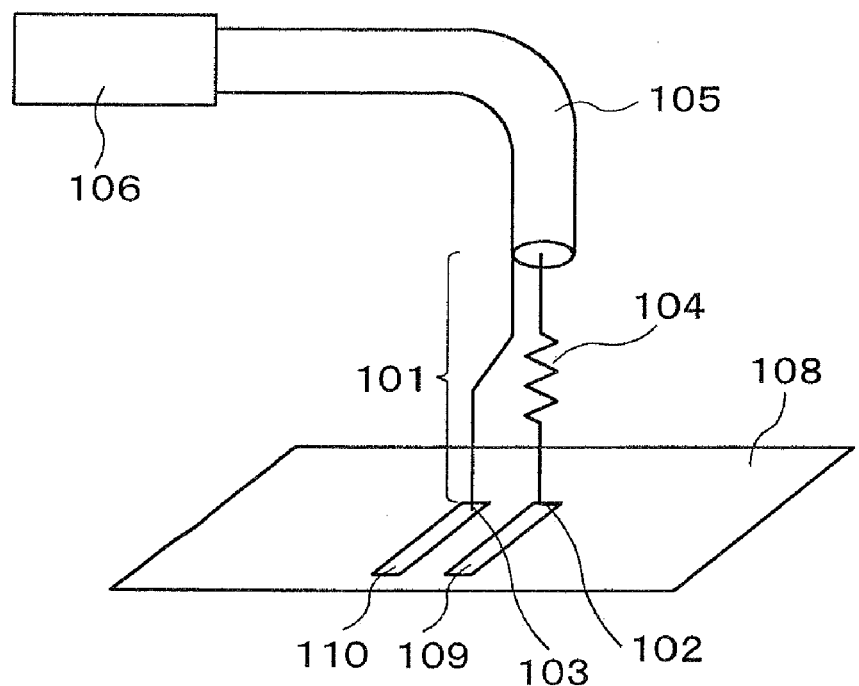
FIG. 8 is a schematic view of a conventional electrical characteristics measurement device.

Ideally, the input impedance Za+50 (Ω) of the probe 1 is preferably kept higher. The impedance error during measurement can thereby be reduced because the load impedance Zl (Ω) of the drive IC 41 approaches the input impedance Zr (Ω) of the receiver IC 43. In practice, however, if the input impedance Za+50 of the probe 1 is increased too much, the input electric current to the measuring instrument 6 will be very low, and as a result the measurement precision may be reduced. The input impedance Za+50 (Ω) of the probe 1 is preferably set to a value that is sufficiently greater than the input impedance Zr (Ω) of the receiver IC 43, but since the input impedance Zr (Ω) of the receiver IC 43 is unknown, the measurement precision may be reduced if the input impedance is fixed as in the conventional electrical characteristics measurement device shown in FIG. 8.

In view of the above, in the electrical characteristics measurement method of the present embodiment, a variable resistance element 4 or another variable impedance element is disposed in the vicinity of the distal end of the probe 1, the impedance Za (Ω) in the vicinity of the distal end of the probe 1 is made to be variable, the input impedance Za+50 (Ω) of the probe 1 is set to a level sufficiently, but not excessively, greater than the input impedance Zr (Ω) of the receiver IC 43, and the impedance Za (Ω) in the vicinity of the distal end of the probe 1 is increased in a stepwise fashion until the impedance Zxo (Ω) of the measurement object 8 is substantially independent from the input impedance Za+50 (Ω) of the probe 1. The measurement precision can thereby be improved over that of a conventional electrical characteristics measurement device in which the impedance of the probe is fixed. This is not limited to the present concrete example, but can also be said of any measurement object.

Specifically, the impedance Za (Ω) in the vicinity of the distal end of the probe 1 is increased by changing the resistance value of the variable resistance element 4, the impedance Zxo (Ω) of the measurement object 8 is re-measured (step S304), and the characteristics of the relation between the impedance Zxo (Ω) of the measurement object 8 and the input impedance Za+50 (Ω) of the probe 1 are derived (step S305). These steps (steps S304 and S305) are repeated until the impedance Zxo (Ω) of the measurement object 8 is substantially independent from the input impedance Za+50 (Ω) of the probe 1.

Figure 5:
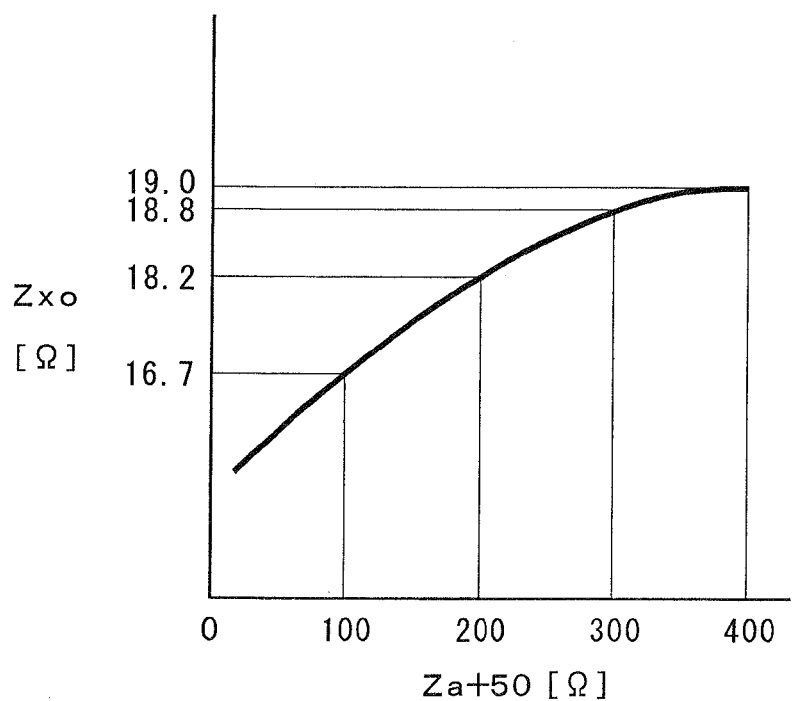
FIG. 5 is a graph showing the relationship between the input impedance of the probe and the electrical characteristics of the measurement object, wherein the input impedance of the probe is plotted on the horizontal axis, and the electrical characteristics of the measurement object are plotted on the vertical axis.

After the impedance Zxo (Ω) of the measurement object 8 becomes substantially independent from the input impedance Za+50 (Ω) of the probe 1, the impedance Za (Ω) in the vicinity of the distal end of the probe 1 is increased to a level that is greater than a prescribed value in accordance with the impedance Zxo (Ω) of the measurement object 8, and the effect that the input impedance Za+50 (Ω) of the probe 1 has on the circuit operation of the measurement object 8 is reduced. As used herein, the term "prescribed value" refers to a value that is determined by the impedance Zxo (Ω) of the measurement object 8. FIG. 5 is a graph showing the relationship between the input impedance Za+50 of the probe and the impedance Zxo of the measurement object, wherein the input impedance Za+50 of the probe 1 is plotted on the horizontal axis, and the impedance Zxo of the measurement object 8 is plotted on the vertical axis. For example, when the input impedance Za+50 of the probe 1 and the impedance Zxo of the measurement object 8 have a relationship such as the one shown in FIG. 5, the slope of the characteristic is comparatively large when the input impedance Za+50 of the probe 1 is less than 300Ω, and the effect on the circuit operation is believed to be considerable when the probe 1 is brought into contact. Conversely, when the input impedance Za+50 of the probe 1 is 300Ω or higher, the slope of the characteristic low, and the effect on the circuit operation is comparatively small.

When the input impedances Za+50 of the probe 1 is set to 100Ω, 200Ω, 300Ω, and 400Ω, and measurement is carried out four times, the slope of the characteristics formed by connecting the measurement points with a straight line is 1.5/100, 0.6/100, and 0.2/100 in the stated order, and the impedance Zxo of the measurement object 8 becomes asymptotic to the true value each time as the number of measurements increases. The decreasing value of these numerical values indicates that the measurement precision is increasing. It is apparent that a smaller slope in the graph, showing the relationship between the input impedance Za+50 of the probe 1 and the impedance Zxo of the measurement object, corresponds to a smaller measurement error.

In view of the above, the slope of the graph showing the relationship between the input impedance Za+50 of the probe 1 and the impedance Zxo of the measurement object is set as a parameter for evaluating the measurement error (step S306). The allowable value of the parameter for evaluating the measurement error is input in advance (step S307), and a comparison is made (step S308) between the parameter derived in step S306 and the allowable value that was input in step S307. When, for example, 0.2/100 is input as the allowable value in step S307, and a comparison is made between this value and the parameter for evaluating the measurement error, the condition whereby the allowable value of the parameter of step S307 for evaluating the measurement error is equal to or greater than the parameter of step S306 for evaluating the measurement error can be satisfied by setting the input impedance Za+50 of the probe 1 to be 400Ω or higher. The allowable measurement precision is thus obtained, and the impedance Zx (Ω) is output from the measuring instrument 6.

If the allowable value of the parameter of step S307 for evaluating the measurement error is less than the parameter of step S306 for evaluating the measurement error, the system returns to step S304, the impedance Za in the vicinity of the distal end of the probe 1 is increased, and the steps thereafter are repeated. In the electrical characteristics measurement device of the present embodiment, a measuring unit, a storage and computation unit, an input unit, and an output unit are disposed in the measuring instrument 6. Steps S301, S302, S303, and S304 are carried out in the measuring unit; steps S305, S306, and S308 are carried out in the storage and computation unit; step S307 is carried out in the input unit; and step S309 is carried out in the output unit.

In the electrical characteristics measurement device of the present embodiment, the input impedance Za+50 of the probe 1 can thus be easily changed because a variable resistance element 4 is disposed in the vicinity of the distal end of the probe 1. Also, there is accordingly no longer a need to consider the relationship between the electrical length and the wavelength between the variable resistance element 4 and measurement object 8, and measurement can easily be carried out because the distance H between the measurement object 8 and variable resistance element 4 is made sufficiently less than the measuring wavelength by disposing the variable resistance element 4 in the vicinity of the signal terminal 2 of the probe 1. For example, when the reflection characteristics are measured using the electrical characteristics measurement device and method described above, first, the impedance in the vicinity of the signal terminal 2 is set to 0 by adjusting the resistance value of the variable resistance element 4, calibration is carried out by using disconnection (infinite), short-circuiting (0Ω), and loading (resistance), and the impedance in the vicinity of the signal terminal 2 is set to a value that is greater than the predictable impedance of the measurement object by varying the resistance value of the variable resistance element 4 so that measurement can be performed. For this reason, the reflection characteristics of a measurement object can easily be measured with good precision by using the electrical characteristics measurement device of the present embodiment.

Figure 6:
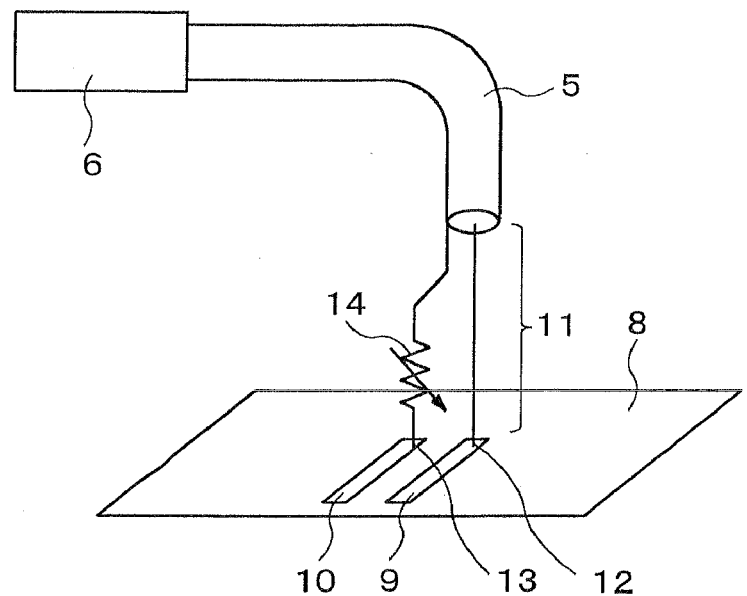
FIG. 6 is a schematic view of the electrical characteristics measurement device of the second embodiment of the present invention.

The electrical characteristics measurement device according to the second embodiment of the present invention is described next. In the electrical characteristics measurement device of the first embodiment described above, a variable resistance element is disposed in the vicinity of the signal terminal of the probe, but the present invention is not limited to this configuration; and an element that can make the impedance variable can be disposed in the vicinity of the distal end of the probe, i.e., a variable impedance element can be disposed in the vicinity of the ground terminal. FIG. 6 is a schematic view of the electrical characteristics measurement device of the present embodiment. In FIG. 6, the same reference numerals are used for the same constituent elements of the electrical characteristics measurement device of the first embodiment shown in FIG. 1, and a detailed description of the constituent elements is omitted. The electrical characteristics measurement device of the present embodiment is configured with a probe 11 connected to a measuring instrument 6 in which the input impedance is 50Ω, for example, by way of a coaxial cable 5 in which the characteristic impedance is 50Ω, for example, as shown in FIG. 6.

The probe 11 comprises a signal terminal 12 and a ground terminal 13, the signal terminal 12 is brought into contact with the conductor pattern 9 disposed on a printed circuit board or another measurement object 8, and the ground terminal 13 is brought into contact with the conductor pattern 10 disposed on the measurement object 8 and kept at ground potential. A variable resistance element 14 is disposed as a variable impedance element in the vicinity of the ground terminal 13 of the probe 11. The impedance in the vicinity of the ground terminal 13 of the probe 11 is thereby made variable. Other than that described above in the electrical characteristics measurement device of the present embodiment, the configuration and operation are the same as the electrical characteristics measurement device of the first embodiment described above.

The electrical characteristics measurement device of the present embodiment is configured with a variable resistance element 4 disposed in the vicinity of the ground terminal 13 of the probe 11 connected to the coaxial cable 5, and the input impedance Za+50 (Ω) of the probe 11 can therefore be easily changed. Since the variable resistance element 14 is disposed in the vicinity of the ground terminal 13, the distance between the measurement object 8 and variable resistance element 14 is sufficiently less than the measuring wavelength, and since there is no longer a need to consider the relationship between the wavelength and the electrical length between the variable resistance element 4 and measurement object 8, the impedance of the measurement object 8 can easily be measured.

Figure 7:
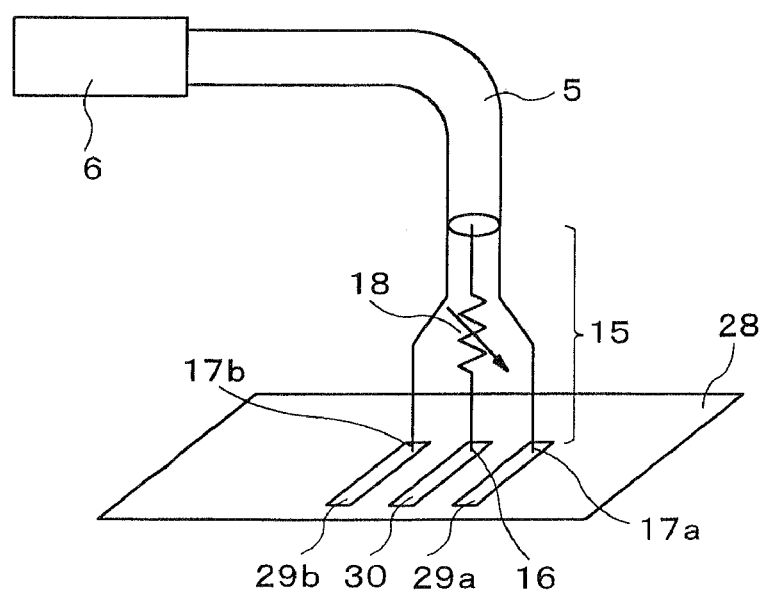
FIG. 7 is a schematic view of the electrical characteristics measurement device of the third embodiment of the present invention.

The electrical characteristics measurement device according to the third embodiment of the present invention is described next. A probe comprising a single signal terminal and a single ground terminal is used in the electrical characteristics measurement device of the first and second embodiments described above, but the present invention is not limited to this configuration, and a probe comprising a plurality of ground terminals can also be used. FIG. 7 is a schematic view of the electrical characteristics measurement device of the present embodiment. In FIG. 7, the same reference numerals are used for the same constituent elements of the electrical characteristics measurement device of the first embodiment shown in FIG. 1, and a detailed description of the constituent elements is omitted. In the electrical characteristics measurement device of the present embodiment, a probe 15 is connected to a measuring instrument 6, which has an impedance of 50Ω, for example, by way of the coaxial cable 5, which has a characteristic impedance of 50Ω, for example, as shown in FIG. 7.

A single signal terminal 16 and two ground terminals 17a and 17b are disposed in the probe 15, and a variable resistance element 18 is disposed as a variable impedance element in the vicinity of the signal terminal 16. This electrical characteristics measurement device is used for measuring a measurement object 28 comprising, for example, two equipotential conductor patterns 29a and 29b and a conductor pattern 30 whose electric potential is different from that of the former two conductor patterns. In this case, the signal terminal 16 of the probe 15 is brought into contact with the conductor pattern 30 of the measurement object 28, and the ground terminals 17a and 17b are brought into contact with the conductor patterns 17 to establish ground potential. Other than that described above in the electrical characteristics measurement device of the present embodiment, the configuration and operation are the same as the electrical characteristics measurement device of the first embodiment described above.

In the electrical characteristics measurement device of the present embodiment, a variable resistance element 18 is disposed in the vicinity of the signal terminal 16 of the probe 15, and the impedance in the vicinity of the signal terminal 16 of the probe 15 is made variable. Therefore, the input impedance of the probe 15 can easily be changed. Also, since the variable resistance element 18 is disposed in the vicinity of the signal terminal 16, the distance between the measurement object 28 and the variable resistance element 18 is sufficiently less than the measuring wavelength, and since there is no longer a need to consider the relationship between the wavelength and the electrical length between the variable resistance element 18 and measurement object 28, the electrical characteristics of the measurement object 28 can easily be measured.

In the electrical characteristics measurement device of the first to third embodiments described above, a variable resistance element is disposed in the vicinity of the signal terminal or ground terminal of the probe, but the present invention is not limited to such a configuration, and the variable impedance element disposed in the probe may be one in which the impedance can be varied, e.g., a variable reactance element or the like.

INDUSTRIAL APPLICABILITY

The present invention is capable of measuring with good precision the reflection characteristics of a printed circuit board or another measurement object.

The invention claimed is:

1. An electrical characteristics measurement method, wherein a probe comprising a single signal terminal, at least one ground terminal, and a variable impedance element disposed in the vicinity of and in electrical communication with a terminal selected from said signal terminal and said ground terminal is used to measure the electrical characteristics of a measurement object, said method comprising the steps of:

setting the impedance of said variable impedance element substantially to 0 Ohms (Ω), disconnecting the signal terminal and ground terminal of the probe at the distal end of said probe, forming a short circuit, and connecting a load to perform calibrations;

making the impedance of said variable impedance element to be greater than a prescribed value, and placing said signal terminal and said ground terminal in contact with said measurement object to measure the electrical characteristics thereof; and spacing said variable impedance element and a distal end of said signal terminal or said ground terminal within approximately 1/10 the measuring wavelength when the electrical characteristics of said measurement object are measured.

2. The electrical characteristic measurement method according to claim 1, wherein said measuring said electrical characteristics comprising the steps of:

setting a parameter for evaluating the measurement error of the electrical characteristics of said measurement object, the parameter being set so that the measurement error becomes smaller as the value of the parameter decreases; and increasing the impedance of said variable impedance element until said parameter becomes equal to or less than an allowable value set in advance.

3. The electrical characteristics measurement method according to claim 2, wherein said calibration comprises the steps of :

disconnecting and calibrating said signal terminal and said ground terminal in a location separated from peripheral objects;

electrically conducting said signal terminal and said ground terminal to a single conductor to perform a short-circuit calibration; and electrically connecting said signal terminal and said ground terminal to a terminal of a 50-Ω resistor to perform a loaded calibration.

4. The electrical characteristics measurement method according to claim 1, wherein said calibration comprises the steps of:

disconnecting and calibrating said signal terminal and said ground terminal in a location separated from peripheral objects;

electrically conducting said signal terminal and said ground terminal to a single conductor to perform a short-circuit calibration; and electrically connecting said signal terminal and said ground terminal to a terminal of a 50-Ω resistor to perform a loaded calibration.

5. An electrical characteristics measurement device for measuring the electrical characteristics of a measurement object comprising:

a measuring instrument, and a probe that is connected to said measuring instrument and has a single signal terminal and at least one ground terminal, wherein said measurement device has a variable impedance element that is connected to said measuring instrument and is disposed in the vicinity of and in electrical communication with one terminal selected from said signal terminal and said ground terminal of said probe, wherein the distance between said variable impendence element and the distal end of said signal terminal or said ground terminal as one of the terminals provide with said variable impedance element is within approximately 1/10 the measuring wavelength when the electrical characteristics of said measurement object are measured.

6. The electrical characteristics measurement device according to claim 5, further comprising:

an input unit for inputting the allowable value of a parameter for evaluating the measurement error of the electrical characteristics of the measurement object;

a storage and computation unit for storing the impendence of said variable impedance element, the measurement values obtained from said probe, and the relational characteristics thereof, calculating a parameter for evaluating the measurement error from the relational characteristics, and comparing said parameter and said allowable value; and an output unit for outputting the results of said storage and computation unit.

7. The electrical characteristics measurement device according to claim 5, further comprising:

an input unit for inputting the allowable value of a parameter for evaluating the measurement error of the electrical characteristics of the measurement object;

a storage and computation unit for storing the impendence of said variable impedance element, the measurement values obtained from said probe, and the relational characteristics thereof, calculating a parameter for evaluating the measurement error from the relational characteristics, and comparing said parameter and said allowable value; and an output unit for outputting the results of said storage and computation unit.

* * * * *